(12) United States Patent
Fukui

(10) Patent No.: US 10,305,208 B2
(45) Date of Patent: May 28, 2019

(54) ELECTRONIC DEVICE

(71) Applicant: TOYODA GOSEI CO., LTD., Kiyosu-shi, Aichi-ken (JP)

(72) Inventor: Hirotaka Fukui, Kiyosu (JP)

(73) Assignee: TOYOTA GOSEI CO., LTD., Aichi-pref. (JP)

( * ) Notice: Subject to any disclaimer, the term of this patent is extended or adjusted under 35 U.S.C. 154(b) by 0 days.

(21) Appl. No.: 15/834,248

(22) Filed: Dec. 7, 2017

(65) Prior Publication Data
US 2018/0175530 A1   Jun. 21, 2018

(30) Foreign Application Priority Data
Dec. 15, 2016 (JP) .................................. 2016-243617

(51) Int. Cl.
| | | |
|---|---|---|
| *H05K 5/00* | (2006.01) | |
| *H05K 5/02* | (2006.01) | |
| *F21V 23/06* | (2006.01) | |
| *H01R 12/57* | (2011.01) | |
| *H01R 12/72* | (2011.01) | |
| *H01R 107/00* | (2006.01) | |
| *H01R 13/405* | (2006.01) | |

(52) U.S. Cl.
CPC .......... *H01R 12/727* (2013.01); *F21V 23/06* (2013.01); *H01R 12/57* (2013.01); *H01R 13/405* (2013.01); *H05K 5/0026* (2013.01); *H05K 5/0217* (2013.01); *H01R 2107/00* (2013.01)

(58) Field of Classification Search
CPC .. H01R 12/57; H01R 12/727; H01R 2107/00; F21V 23/06; H05K 5/0026; H05K 5/0217; H05K 7/14

USPC ................................ 439/736, 76.1; 361/752
See application file for complete search history.

(56) References Cited

U.S. PATENT DOCUMENTS

| | | | | | |
|---|---|---|---|---|---|
| 5,313,364 | A | * | 5/1994 | Omori ............. | G06K 19/07743 174/260 |
| 5,712,766 | A | * | 1/1998 | Feldman ................ | H01R 23/70 361/728 |
| 5,772,452 | A | * | 6/1998 | Aoyama .............. | H01R 12/716 439/74 |
| 6,428,332 | B1 | * | 8/2002 | Nakamura ........... | H01R 12/712 439/733.1 |
| 7,118,646 | B2 | * | 10/2006 | Hunkeler ............ | B60R 16/0239 156/293 |

(Continued)

FOREIGN PATENT DOCUMENTS

| | | |
|---|---|---|
| JP | 2007-329413 A | 12/2007 |
| JP | 2013-152815 A | 8/2013 |
| JP | 2015-133562 A | 7/2015 |

*Primary Examiner* — Edwin A. Leon
*Assistant Examiner* — Oscar C Jimenez
(74) *Attorney, Agent, or Firm* — Posz Law Group, PLC

(57) ABSTRACT

An electronic device includes: a substrate; a housing which covers the substrate; a plurality of conductive pins which are mounted on one edge portion of the substrate and each of which includes: a projection portion projecting from the substrate along a plane of the substrate; and a soldering portion soldered to the substrate; and a resin molded portion which includes a connection portion connecting the plurality of conductive pins. The resin molded portion includes a first projection portion, and the housing includes a recess portion receiving the first projection portion.

5 Claims, 6 Drawing Sheets

(56) References Cited

U.S. PATENT DOCUMENTS

| | | | |
|---|---|---|---|
| 8,230,575 B2* | 7/2012 | Veenstra | B60Q 1/2696 |
| | | | 174/377 |
| 8,734,182 B2* | 5/2014 | Peng | H05K 5/0278 |
| | | | 439/607.01 |
| 2005/0020104 A1* | 1/2005 | Yamamoto | H01R 13/4361 |
| | | | 439/76.1 |
| 2005/0208797 A1* | 9/2005 | Duncan | H01R 4/028 |
| | | | 439/83 |
| 2008/0062711 A1* | 3/2008 | Veenstra | B29C 45/14639 |
| | | | 362/546 |
| 2008/0265837 A1* | 10/2008 | Okano | H05K 3/305 |
| | | | 320/112 |
| 2009/0068862 A1* | 3/2009 | Honda | H05K 5/0052 |
| | | | 439/78 |
| 2009/0129035 A1* | 5/2009 | Kojima | H05K 5/0052 |
| | | | 361/752 |
| 2010/0045581 A1* | 2/2010 | Yeon | H01R 13/64 |
| | | | 345/87 |
| 2011/0242774 A1* | 10/2011 | Lu | H01R 12/724 |
| | | | 361/752 |
| 2015/0146433 A1* | 5/2015 | Suzuki | B60Q 3/80 |
| | | | 362/311.01 |
| 2017/0105306 A1* | 4/2017 | Takahashi | H01M 2/206 |
| 2017/0117642 A1* | 4/2017 | Juanes Ribas | H01R 12/58 |
| 2017/0146213 A1* | 5/2017 | Kosugi | F21V 29/767 |
| 2017/0250589 A1* | 8/2017 | Nakamura | H02K 11/33 |
| 2017/0334375 A1* | 11/2017 | Shigyo | H01R 13/518 |

* cited by examiner

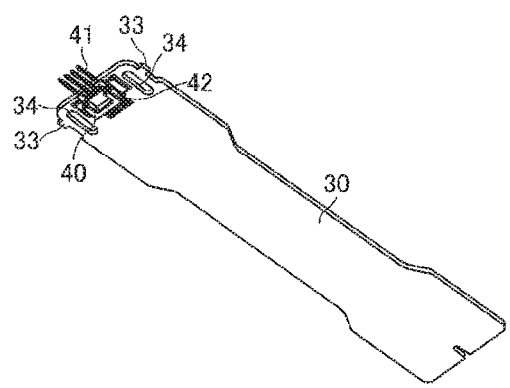
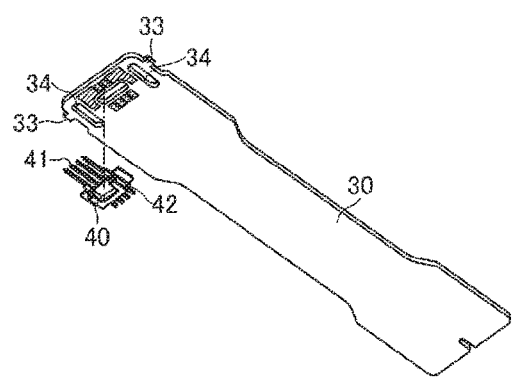
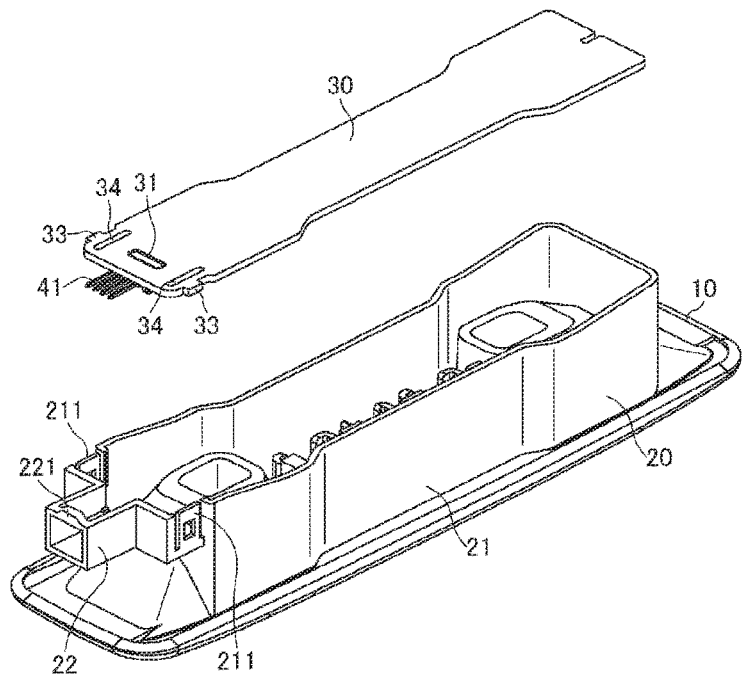

ELECTRONIC DEVICE

CROSS-REFERENCE TO RELATED APPLICATION(S)

This application is based upon and claims the benefit of priority from prior Japanese patent application No. 2016-243617, filed on Dec. 15, 2016, the entire contents of which are incorporated herein by reference.

BACKGROUND

The present invention relates to an electronic device.

As a method for fixing a conductive pin to a substrate of an electronic device, a method for fixing a connector, which has a conductive pin and is separated from a casing (housing) of a device, to the casing has been widely used. As an example of such a connector, JP-A-2015-133562 discloses an external connection connector. JP-A-2015-133562 describes that a connector holder for positioning the connector is used in a configuration in which the connector is fixed in a casing of a mobile phone having a connector opening. More specifically, left and right side surfaces and an upper surface of the connector, which is a back side surface in an insertion direction, are brought into contact with left and right inner surfaces and a lower inner surface of the connector holder, thereby positioning the external connection connector with respect to the casing (see Paragraphs [0015] and [0016], FIGS. 1, 4 to 7, etc. of JP-A-2015-133562).

JP-A-2013-152815 and JP-A-2007-329413 disclose other examples of the connector separated from the casing and fixed to the casing.

When the connector separated from the casing as described in JP-A-2015-133562, JP-A-2013-152815 or JP-A-2007-329413 is used to fix the conductive pin to the substrate, there are problems that a production cost of the device is increased, and reduction in size of the device is hindered. In addition, there is a problem that a separate member is required to fix the connector to the casing. That is, in the technique of JP-A-2015-133562, the connector holder is used to fix the connector to the casing. In the technique of JP-A-2013-152815, a screw and an O-ring are used to fix the connector to the casing (see Paragraphs [0027] and [0029], and FIG. 3, etc. of JP-A-2013-152815). In the technique of JP-A-2007-329413, a screw is used to fix the connector to the casing (see Paragraph [0035], and FIG. 2, etc. of JP-A-2007-329413). In addition, since the conductive pin is fixed to the casing through a plurality of members such as a connector and a member for fixing the connector to the casing, there is a possibility that accumulated tolerances of positions between the plurality of members become large and positioning accuracy of the conductive pin with respect to the casing is lowered. As a result, there is a possibility that contact performance and conduction performance between the conductive pin and a terminal of a mating connector is lowered.

SUMMARY

It is therefore an object of the invention to provide an electronic device in which a conductive pin is fixed to a housing of the electronic device without a connector separated from the housing and which is capable of exhibiting sufficient positioning accuracy of the pin with respect to the housing.

In order to achieve the object, according to an aspect of the invention, there is provided an electronic device comprising: a substrate; a housing which covers the substrate; a plurality of conductive pins which are mounted on one edge portion of the substrate and each of which includes: a projection portion projecting from the substrate along a plane of the substrate; and a soldering portion soldered to the substrate; and a resin molded portion which includes a connection portion connecting the plurality of conductive pins, wherein the resin molded portion includes a first projection portion, and the housing includes a recess portion receiving the first projection portion.

BRIEF DESCRIPTION OF THE DRAWINGS

FIGS. 4A and 4B show a substrate of the lighting device according to the embodiment. FIG. 4A is a perspective view, and FIG. 4B is an exploded perspective view.

FIG. 5 is an exploded perspective view of the lighting device according to the embodiment.

DETAILED DESCRIPTION OF EXEMPLARY EMBODIMENTS

Figure 1:
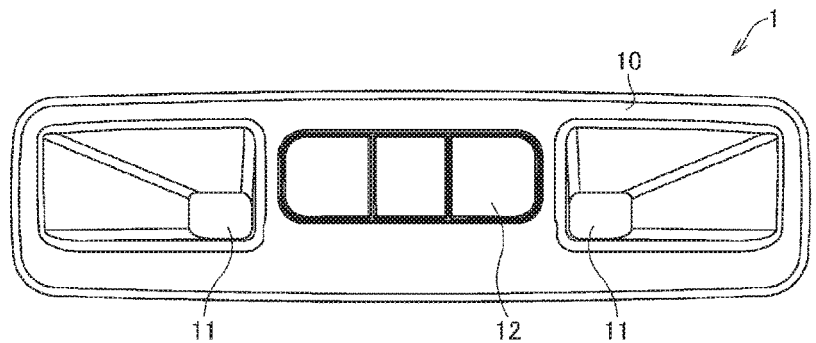
FIG. 1 is a front view of a lighting device according to an embodiment of the present invention.
Figure 2:
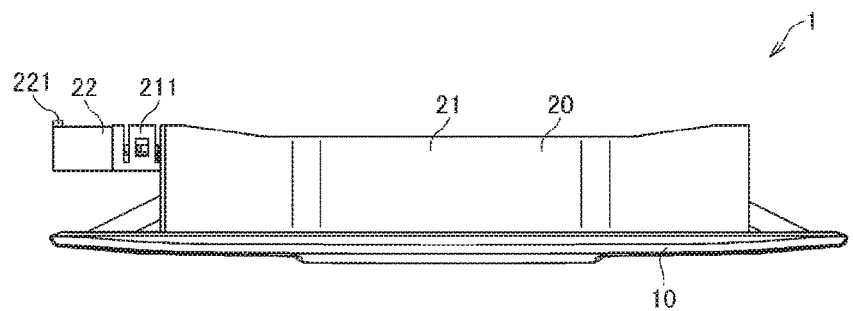
FIG. 2 is a side view of the lighting device according to the embodiment.
Figure 3:
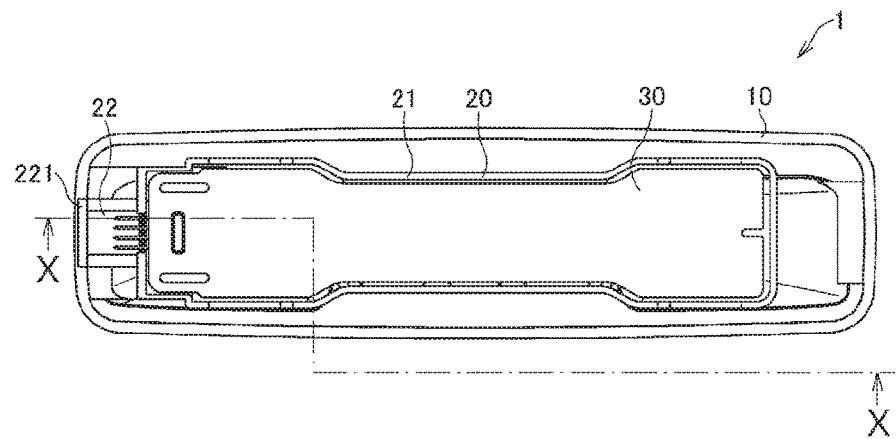
FIG. 3 is a rear view of the lighting device according to the embodiment.

Hereinafter, a lighting device will be described as an example of an electronic device according to one embodiment of the present invention. However, an electronic device to which the present invention can be applied is not limited to the lighting device. FIG. 1 is a front view of a lighting device 1 according to the embodiment of the present invention, FIG. 2 is a side view of the lighting device 1, and FIG. 3 is a rear view of the lighting device 1. Specifically, the lighting device 1 of the illustrated example is a map lamp provided on a ceiling of a vehicle compartment of an automobile, and includes a design portion 10 including a light emitting portion 11 and a switch portion 12, a housing 20 attached to a rear side of the design portion 10 or integrally formed therewith, a substrate 30 housed in the housing 20, and a pin header 40 mounted on the substrate 30.

Figure 6:
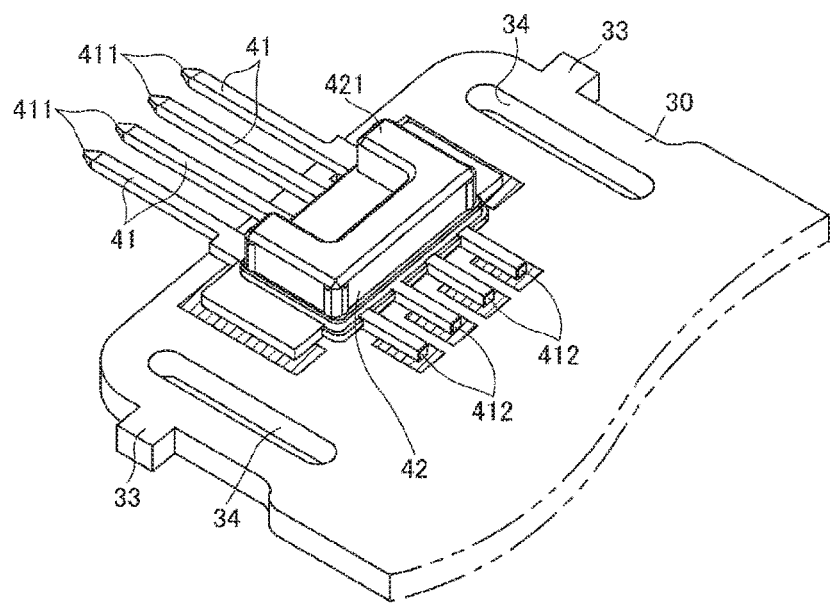
FIG. 6 is a perspective view showing main portions of the substrate in FIG. 4A.
Figure 7A:
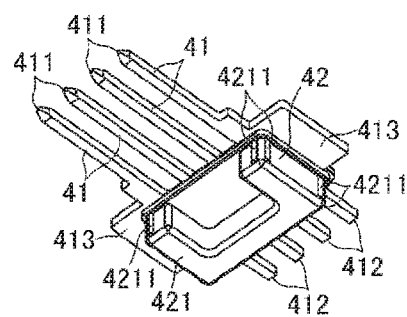
FIGS. 7A and 7B are perspective views showing a pin header in FIG. 6.
Figure 7B:
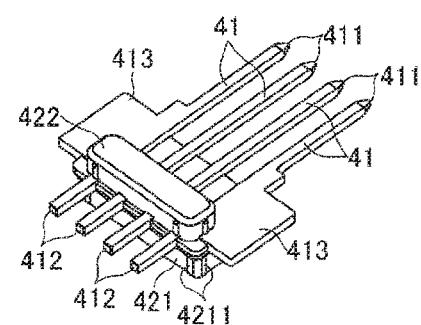
Figure 7C:
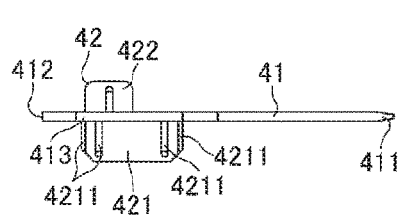
FIG. 7C is a side view of the pin header.

FIG. 4A is a perspective view showing a side on which the pin header 40 is mounted on the substrate 30. FIG. 4B is a view showing a state before the pin header 40 is mounted on the substrate 30. FIG. 6 is an enlarged perspective view showing a state where the pin header 40 is mounted on one edge portion of the substrate 30 (that is, a portion in the vicinity of one of edges). FIG. 7A is a perspective view of the pin header 40. FIG. 7B is a perspective view showing an opposite side of the pin header 40 in FIG. 7A, that is, a side fixed to the substrate 30. FIG. 7C is a view of the pin header 40 viewed from a side (that is, a side of a side surface).

Figure 7D:
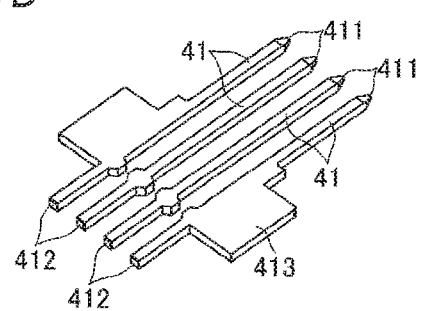
FIG. 7D is a perspective view showing only pins of the pin header.

As shown mainly in FIG. 6, and FIGS. 7A to 7C, the pin header 40 includes a plurality of pins 41 (conductive pins) made of a metal having conductivity and a resin portion 42 made of synthetic resin having an insulation property. The pin header 40, for example, is formed by loading the plurality of pins 41 in a resin molding die such that the pins 41 are spaced apart from each other and longitudinal directions thereof are parallel to each other as shown in FIG. 7D, then injecting resin into the molding die, covering a portion excluding at least a tip end portion 411 and a base end portion 412 of each of the plurality of pins 41 with molten resin, solidifying the resin to form the resin portion 42, and integrating the plurality of pins 41 with the resin portion 42.

Two pins 41 positioned at both ends in a direction orthogonal to the longitudinal direction of the plurality of pins 41 (that is, an arrangement direction of the plurality of pins 41) include protrusion portions 413 each protruding outward therefrom in the arrangement direction. The protrusion portions 413 are positioned between the tip end portions 411 and the base end portions 412 in the longitudinal direction of the pins 41. The protrusion portions 413 are exposed from the resin portion 42.

As shown in FIGS. 7A to 7C, the resin portion 42 of the pin header 40 includes a first projection portion 421 projecting to one side of a direction orthogonal to a plane on which the plurality of pins 41 are arranged and a second projection portion 422 projecting to the other side of the direction. In the first projection portion 421 and the second projection portion 422, the portion projecting to a side opposite to the substrate 30 is defined as the first projection portion 421, and the portion projecting to a side on the substrate 30 is defined as the second projection portion 422, when the pin header 40 is attached to the substrate 30. The first projection portion 421 has a U shape in a plan view. That is, the first projection portion 421 is formed in a U shape including a transverse portion extending in the arrangement direction of the plurality of pins 41 and two longitudinal portions extending from both ends of the transverse portion to a side of the tip end portions 411 of the plurality of pins 41. The first projection portion 421 includes a plurality of ribs 4211 extending in a projection direction on a side surface which is an outer side of the U shape among a plurality of side surfaces substantially orthogonal to an end surface in the projection direction.

As shown in FIGS. 4A and 6, the pin header 40 is mounted on the one edge portion of the substrate 30, at this time, a portion including the tip end portions 411 of the plurality of pins 41 is mounted so as to project from one edge of the substrate along the same plane as the substrate 30 (that is, parallel to the substrate 30). The mounting of the plurality of pins 41 on the substrate 30 is performed by soldering predetermined portions of the plurality of pins 41 to the substrate 30. In addition to the pin header 40, elements such as light emitting elements (not shown) are mounted on the substrate 30.

Figure 8A:
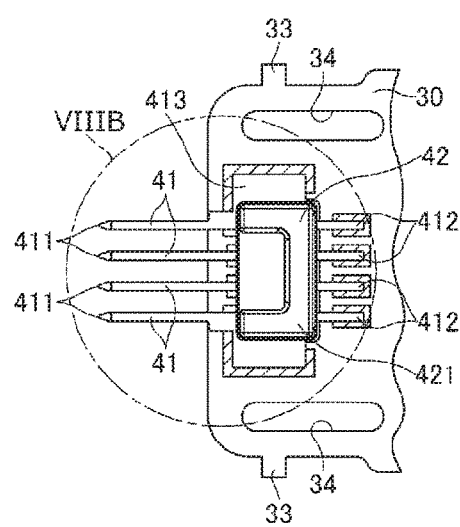
FIG. 8A is a plan view showing the main portions of the substrate in FIG. 4A.
Figure 8B:
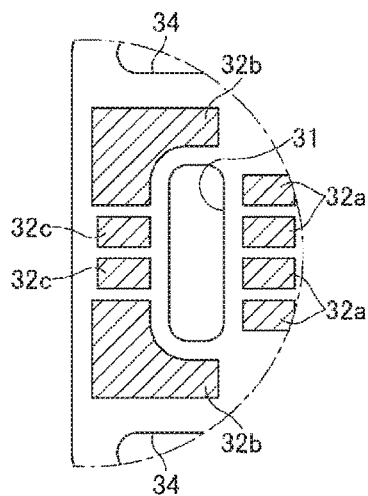
FIG. 8B is a plan view showing one edge portion of the substrate before the pin header is fixed.
Figure 8C:
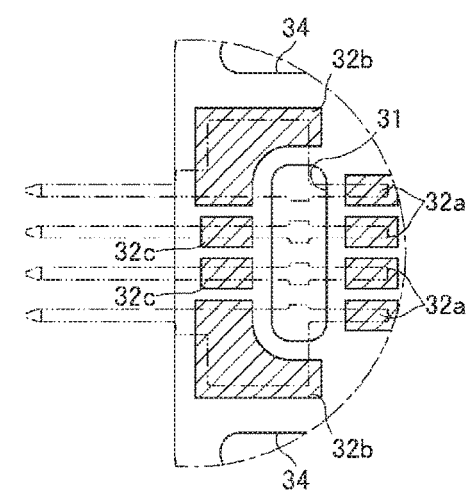
FIG. 8C is an explanatory view for explaining a position where the pin header is fixed to the one edge portion of the substrate.

In FIG. 6, portions which are indicated by oblique lines are solder portions, and the plurality of pins 41 are soldered to the substrate 30 at the solder portions. FIG. 8A is a plan view showing portions of the pin header 40 and the substrate 30 shown in FIG. 6. FIG. 8B is a view showing a portion within a range indicated by a one-dot chain line VIIIB of the substrate 30 in FIG. 8A, and shows a state immediately before the pin header 40 is soldered to the substrate 30. In FIG. 8B, the solder portions are indicated by oblique lines. Positions where the plurality of pins 41 are fixed to the substrate 30 by soldering are shown in FIG. 8C. In FIG. 8C, positions where the pins 41 are fixed by soldering are indicated by two-dot chain lines (the resin portion 42 is not shown).

Among the solder portions which are indicated by the oblique lines in FIGS. 8B and 8C, portions denoted by reference numeral 32a are portions for joining the base end portions 412 of the plurality of pins 41 and portions in the vicinity thereof (that is, conducting portions), and the pins 41 are fixed to the substrate 30 and are in electrical conduction with a circuit wiring of the substrate 30 through the solder portions 32a. Among the solder portions, portions denoted by reference numeral 32b are portions for joining portions including the protrusion portions 413 of the pins 41 at both ends in the arrangement direction of the plurality of pins 41. Solder portions denoted by reference numeral 32c are portions for joining portions of two pins 41 on an inner side in the arrangement direction of the plurality of pins 41 between the tip end portions 411 and the base end portions 412. The solder portions denoted by reference numerals 32b, 32c have a function of exclusively fixing the pins 41 to the substrate 30 and do not conduct the pins 41 with the circuit wiring of the substrate 30.

Soldering of the pin header 40 to the solder portions 32a, 32b, 32c described above is performed by printing solder pastes at positions corresponding to the solder portions 32a, 32b, 32c of the substrate 30, placing the pin header 41 such that the pins 41 are put on the positions indicated by the two-dot chain lines in FIG. 8C, and melting a solder in a reflow furnace.

FIG. 5 is an exploded perspective view of the lighting device 1. As shown in FIG. 5, the substrate 30 is housed and fixed on an inner side of the housing 20 from an opening on a rear side of the housing 20. The housing 20 includes a substrate housing portion 21 for housing the substrate 30 and a pin housing portion 22 for housing portions of the plurality of pins 41 projecting from the substrate 30 (that is, projection portions).

As shown in FIGS. 4A to 5, the substrate 30 includes engagement projections 33 projecting on both sides of the one edge portion where the pin header 40 is fixed. The substrate housing portion 21 includes engagement portions 211 at two positions corresponding to the two engagement projections 33 of the substrate 30. Each engagement portion 211 includes an engagement hole for engaging with the engagement projection 33 and notches on both sides of the engagement hole. The notches extend to an edge of an opening of the substrate housing portion 21. Accordingly, when the substrate 30 is inserted from the opening of the substrate housing portion 21, the engagement projection 33 elastically deforms an edge portion of the engagement portion 211 and pushes to open the same, and the substrate 30 is further pushed, and thereby each engagement projection 33 is engaged with the engagement hole of the corresponding engagement portion 211.

The substrate 30 includes elliptic buffer holes 34 on inner sides of the two engagement projections 33 respectively. When elastically deforming the edge portion of the engagement portion 211 and pushing to open the same by the engagement projection 33 in order to insert the substrate 30 into the substrate housing portion 21, the engagement projection 33 receives a reaction force from the edge portion of the engagement portion 211, but the influence of the reaction force extending to the solder portions 32a, 32b, 32c can be avoided by the presence of the buffer holes 34. That is, it is possible to avoid occurrence of troubles such as breakage in the solder portions 32a, 32b, 32c due to the stress generated in the substrate 30 by the reaction force applied to the engagement projections 33 when the substrate 30 is attached to the housing 20.

By combining the plurality of pins 41 and the pin housing portion 22 so as to house the plurality of pins 41 in the pin housing portion 22, the plurality of pins 41 and the pin housing portion 22 function as a connector to be connected to a socket connector. Therefore, an opening for receiving the socket connector is formed on a tip end side (that is, a side of a direction to which the projection portions of the pins 41 project) of the pin housing portion 22, and an engagement portion 221 for engaging with a hook of the socket connector is formed at an edge of the opening. When the socket connector is connected to a connector of the lighting device 1, a portion (projection portion) of each of the plurality of pins 41 projecting from one edge of the substrate 30 into the pin housing portion 22 is brought into contact with a terminal of the socket connector, thereby realizing conduction.

In this manner, the pins 41 are directly fixed to the one edge portion of the substrate 30, tip ends of the pins 41 are projected from the one edge of the substrate in parallel with the substrate 30, and the pins 41 and the housing 20 are enabled to function as a connector, and thereby the number of parts can be reduced as compared with a case where a connector separated from the substrate 30 is used. Of course, a separate member for fixing a separate connector to the housing 20 is not required. Accordingly, reduction in production cost and size of the lighting device 1 can be achieved.

Figure 9A:
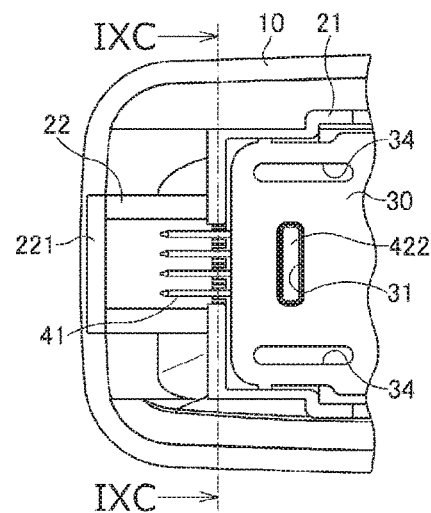
FIG. 9A is a plan view showing main portions of the lighting device in FIG. 3.
Figure 9B:
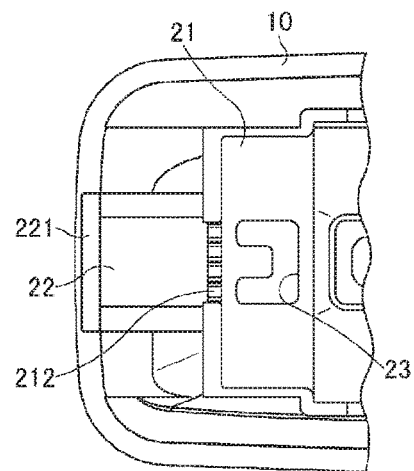
FIG. 9B is a plan view showing a state where the substrate is removed in the main portions of the lighting device in FIG. 9A.
Figure 10:
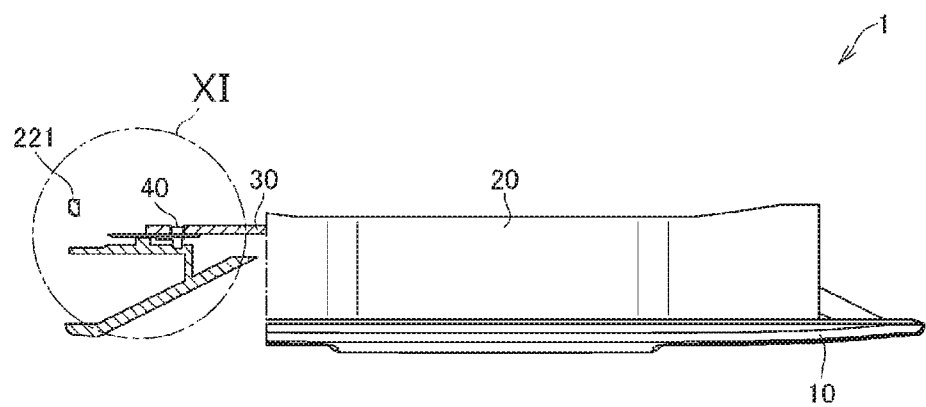
FIG. 10 is a partial cross-sectional view showing a state where the lighting device cut along a one-dot chain line X-X in FIG. 3 is viewed in an arrow direction.

FIG. 9A is a plan view showing main portions (portions in vicinity of the connector) of the lighting device in FIG. 3, and FIG. 9B is a plan view showing a state where the substrate 30 is removed from the housing 20 in the main portions of the lighting device in FIG. 9A. FIG. 10 is a partial cross-sectional view showing a state where the lighting device 1 cut along a one-dot chain line X-X in FIG. 3 is viewed in an arrow direction, and FIG. 11 is an enlarged partial cross-sectional view showing an enlarged partial cross-sectional portion of the lighting device 1 surrounded by a one-dot chain line XI in FIG. 10.

Figure 11:
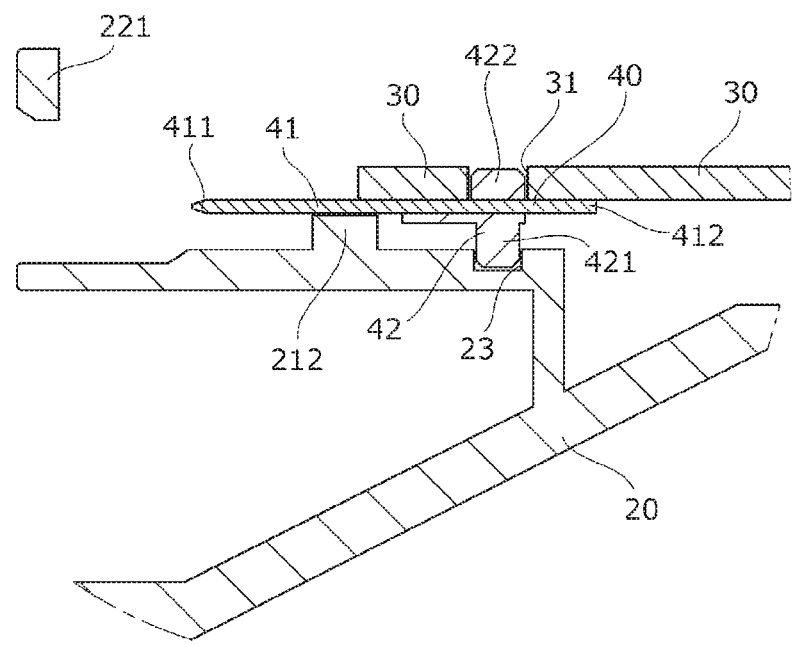
FIG. 11 is an enlarged partial cross-sectional view showing an enlarged cross-sectional portion of the lighting device surrounded by a one-dot chain line XI in FIG. 10.

As shown in FIG. 9A, FIG. 10 and FIG. 11, a recess portion 31 is formed in the one edge portion of the substrate 30, and the second projection portion 422 of the pin header 40 is fitted to the recess portion 31 when the pin header 40 is fixed to the substrate 30, thereby positioning the pin header 40 with respect to the substrate 30.

As shown in FIG. 9B, a recess portion 23 to which the first projection portion 421 of the pin header 40 is fitted is formed in the housing 20, and by fitting the first projection portion 421 to the recess portion 23, positioning of the pin header 40 (in particular, the plurality of pins 41) with respect to the housing 20 in one plane (in this example, a plane on which the plurality of pins 41 are arranged) is performed. As shown in FIG. 9B, the recess portion 23 has a U shape in a plan view so as to correspond to a shape of the first projection portion 421 of the pin header 40. Since the first projection portion 421 includes at least two non-parallel side surfaces because of being formed in a U shape in the plan view, the pin header 40 (in particular, the plurality of pins 41) with respect to the housing 20 in one plane can be reliably and accurately positioned. In addition, the first projection portion 421 is formed along an external shape of a portion (connection portion) for connecting the plurality of pins 41 of the resin portion 42. Accordingly, a cross-sectional area of the first projection portion 421 can be increased as much as possible and the positioning accuracy of the pin header 40 (in particular, the plurality of pins 41) with respect to the housing 20 in one plane can be improved.

When the first projection portion 421 is inserted into the recess portion 23 of the housing 20, the ribs 4211 are strongly brought into contact with an inner peripheral surface of the recess portion 23, and thereby a state where the first projection portion 421 is tightly fitted to the recess portion 23 is formed. Accordingly, the positioning accuracy of the pin header 40 (in particular, the plurality of pins 41) with respect to the housing 20 in one plane is improved.

Figure 9C:
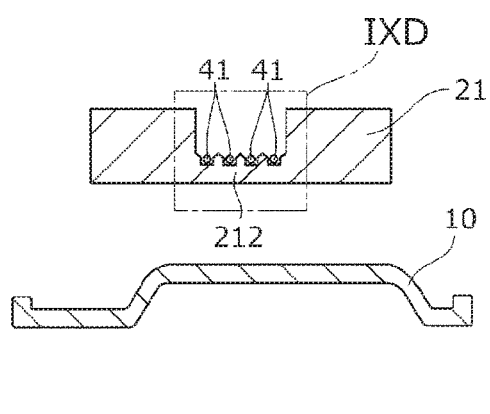
FIG. 9C is a cross-sectional view showing a cross section of the main portions of the lighting device in FIG. 9A taken along a line IXC-IXC.
Figure 9D:
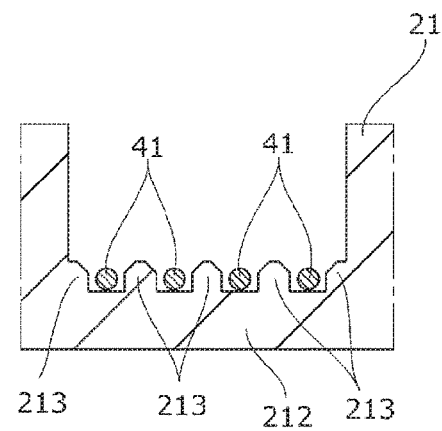
FIG. 9D is an enlarged partial cross-sectional view showing an enlarged portion surrounded by a one-dot chain line IXD in FIG. 9C.

FIG. 9C is a cross-sectional view showing a cross section of the main portions of the lighting device 1 in FIG. 9A taken along a line IXC-IXC. FIG. 9D is an enlarged partial cross-sectional view showing an enlarged portion surrounded by a one-dot chain line IXD in FIG. 9C.

As shown in FIG. 9B, FIG. 9C and FIG. 11, the substrate housing portion 21 of the housing 20 is configured to include a pin support portion 212 by partially cutting out an edge portion defining a boundary with the pin housing portion 22 from an opening side. The plurality of pins 41 are brought into contact with the pin support portion 212 on side surfaces thereof and are supported by the pin support portion 212. Accordingly, the positioning of the plurality of pins 41 with respect to the housing 20 in a direction orthogonal to the one plane is performed with high accuracy. In addition, as shown in FIG. 9D, the pin support portion 212 projects to the opening side of the housing 20 on both sides of each pin 41 and includes convex portions 213 for holding the pins 41. Tapers are formed at upper ends of the convex portions 213, so that each pin 41 is easily guided between the convex portions 213.

The first projection portion 421 of the pin header 40, the recess portion 23 of the housing 20, and the support portion 212 as described above are provided, so that three-dimensional positioning of the plurality of pins 41 with respect to the housing 20 is performed with high accuracy. As a result, favorable contact is realized between the plurality of pins 41 and the terminals of the mating connector connected to the connector including the plurality of pins 41 and the pin housing portion 22.

In this manner, since the plurality of pins 41 are positioned with respect to the housing 20 by the contacting the support portion 212 and fitting the first projection portion 421 to the recess portion 23, the positioning accuracy is improved as compared with a case where the pins are positioned with respect to the housing through a plurality of members such as a separate connector and a separate member for fixing the connector to the housing as in a related-art example.

As shown in FIG. 11, a lower end of the first projection portion 421 is in contact with a bottom surface of the recess portion 23, thereby contributing to stable supporting and positioning of the pin header 40, in particular the plurality of pins 41. However, the lower end of the first projection portion 421 is spaced apart from the bottom surface of the recess portion 23, and the plurality of pins 41 and the pin support portion 212 are brought into contact with each other, thereby positioning of the plurality of pins 41 with respect to the housing 20 may be realized.

The cross-sectional shape of the first projection portion 421 in a plan view is a U shape, but the cross-sectional shape in the plan view may be a shape other than a U shape as long as the first projection portion 421 has at least two non-parallel side surfaces. At least two non-parallel side surfaces of the first projection portion 421 may not be perpendicular or parallel to the longitudinal direction of the plurality of pins 41. The shape of the recess portion 23 of the housing 20 may be any shape as long as the first projection portion 421 can be fitted (in particular, tightly fitted).

The present invention is not limited to the description of the embodiments of the invention and modifications thereof in any way. Various modifications are also included in the present invention as long as those skilled in the art can easily conceive without departing from the scope of the claims.

According to an aspect of the invention, there is provided an electronic device comprising: a substrate; a housing which covers the substrate; a plurality of conductive pins which are mounted on one edge portion of the substrate and each of which includes: a projection portion projecting from the substrate along a plane of the substrate; and a soldering portion soldered to the substrate; and a resin molded portion which includes a connection portion connecting the plurality of conductive pins, wherein the resin molded portion includes a first projection portion, and the housing includes a recess portion receiving the first projection portion.

According to the above configuration, since the conductive pins are directly mounted on the one edge portion of the substrate and the substrate is covered by the housing, the number of parts of the device can be reduced, as compared with a configuration in which a connector separated from a housing is used. This contributes to reduction in production cost of the device and reduction in size of the device. In addition, since the housing includes the recess portion to which the first projection portion of the resin molded portion is fitted, the positioning of the conductive pins with respect to the housing can be reliably and accurately performed by fitting the projection portion to the recess portion. Accordingly, favorable contact performance between the conductive pins and the terminal of a mating connector can be obtained.

The first projection portion may include at least two side surfaces which are not parallel to each other. With such a configuration, positioning accuracy of the conductive pins with respect to the housing in one plane is improved.

A tip end of the first projection portion may be in contact with a bottom surface of the recess portion. With such a configuration, the positioning accuracy of the conductive pins with respect to the housing in a direction orthogonal to the one plane is improved.

The housing may include a support portion which is in contact with the projection portions of the plurality of conductive pins. With such a configuration, the conductive pins can be stably supported by the support portion, and the positioning accuracy of the conductive pins with respect to the housing in the direction orthogonal to the one plane is improved.

The resin molded portion may include a second projection portion, and the substrate may include a recess portion receiving the second projection portion. With such a configuration, the positioning accuracy of the conductive pins with respect to the substrate is improved.

The first projection portion may have a U shape in a plan view, and each side of the first projection portion may be along an external shape of the connection portion of the resin molded portion. With such a configuration, a fitting area of the first projection portion and the recess portion of the housing can be ensured to be wide within a range which is along the external shape of the connection portion, and the positioning accuracy of the conductive pins with respect to the housing in one plane is improved.

What is claimed is:

1. An electronic device comprising: a substrate; a housing which covers the substrate; a plurality of conductive pins which are arranged in a plane and mounted on one edge portion of the substrate, each conductive pin of the plurality of pins which includes a projection portion projecting from the substrate along a plane of the substrate and a soldering portion soldered to the substrate; and a resin molded portion which includes a connection portion connecting the plurality of conductive pins, wherein the resin molded portion includes a first projection portion extending in a first direction orthogonal to the plane in which the plurality of conductive pins are arranged, and the housing includes a recess portion receiving the first projection portion; wherein the resin molded portion includes a second projection portion, the substrate includes a recess portion receiving the second projection portion extending in a second direction opposite to the first direction.

2. The electronic device according to claim 1, wherein the first projection portion includes at least two side surfaces which are not parallel to each other.

3. The electronic device according to claim 1, wherein a tip end of the first projection portion is in contact with a bottom surface of the recess portion.

4. The electronic device according to claim 1, wherein the housing includes a support portion which is in contact with the projection portions of the plurality of conductive pins.

5. The electronic device according to claim 1, wherein the first projection portion has a U shape in a plan view, and each side of the first projection portion extends along an external shape of the connection portion of the resin molded portion.

* * * * *